United States Patent [19]

Iwasaki

[11] Patent Number: 5,550,709
[45] Date of Patent: Aug. 27, 1996

[54] EXTERNAL STORAGE DEVICE

[75] Inventor: Hiroshi Iwasaki, Yokohama, Japan

[73] Assignee: Kabushiki Kaisha Toshiba, Japan

[21] Appl. No.: 205,451

[22] Filed: Mar. 4, 1994

[30] Foreign Application Priority Data

Jul. 23, 1993 [JP] Japan .................................. 5-182650

[51] Int. Cl.⁶ ............................................ H05K 7/10
[52] U.S. Cl. ........................ 361/684; 361/737; 235/492
[58] Field of Search ................................ 361/684, 737, 361/733, 754; 235/492; 439/160; 428/76

[56] References Cited

U.S. PATENT DOCUMENTS

| | | | |
|---|---|---|---|
| 4,943,464 | 7/1990 | Gloton et al. | 428/76 |
| 5,153,818 | 10/1992 | Mukougawa et al. | 361/395 |
| 5,299,089 | 3/1994 | Lwee | 361/684 |
| 5,375,037 | 12/1994 | Le Roux | 361/684 |

FOREIGN PATENT DOCUMENTS

| | | |
|---|---|---|
| 3-2099 | 1/1991 | Japan . |
| 3-114788 | 5/1991 | Japan . |
| 4-148999 | 5/1992 | Japan . |

*Primary Examiner*—Leo P. Picard
*Assistant Examiner*—Phuong T. Vu

[57] ABSTRACT

An external storage device includes an external storage device main and an external storage device unit. The external storage device main includes a thin type external storage device module formed into a one-side sealed package and having a storage medium series element containing at least one non-volatile semiconductor memory device, and a flat type external connection terminal connected to an input/output terminal of the storage medium series element and led and exposed to a backside of the external storage device module. The external storage device unit includes an external storage device main detachable section for engaging, insertedly attaching and detaching the external storage device main, a resilient contact electrically connecting to the external connection terminal of the external storage device main to be mounted, and at least a part of circuit function for driving and controlling the storage medium series element.

11 Claims, 4 Drawing Sheets

EXTERNAL STORAGE DEVICE

BACKGROUND OF THE INVENTION

1. Field of the Invention

The invention relates to external storage devices with a thin thickness type that are releasably or exchangeably used for storage equipment and devices as an external storage medium.

2. Description of the Related Art

Two types of storage devices (memory elements), which are capable of recording and saving various data, have been utilized, namely, one is incorporated and fixed within storage equipment or devices, and the other is releasably or exchangeably incorporated in the storage equipment or devices. For the latter type, the external storage device, for example, floppy disks can freely be attached or detached by one touch operation. The floppy disks being the storage mediums can separately be used depending on purpose and object. This therefore produces easier data reduction with optional classification, recording, and saving. However, a problem arises in the floppy disks described, where first, the data occasionally disappears when recording or saving the data disadvantageously making the floppy disk less reliable together with its slower access time. Next, when employing the smaller sized floppy disks in response to a miniaturization policy, a storing area of the storage medium is correspondingly smaller to reduce storage capacity, thus giving the adverse effect in realizing the compact size and high capacity therefor. On the other hand, semiconductor memory devices used as an external storage device, such as IC memory cards, can largely solve the problems in the floppy disks such as less reliability on recording and saving the data and the slower access time. In general, the IC memory cards comprise a functional circuit in which circuit components containing the semiconductor memory devices or elements are mounted on substrates, a resin case incorporating therein with the functional circuit as an inside attachment, a cover for covering and sealing an opening surface of the resin case, and external connection terminals such as two piece connectors which are attached on one edge of the resin case and electrically connect the functional circuit and the storage equipment/device.

However, the IC memory cards are assembled with a large amount of components and parts, where a relatively complicated structure is required with limitation to a thickness of the IC memory card, resulting in the difficulty in realizing the compact size. Further, disadvantages arise in practical use because of lower cost performance or production yields during mass production in addition to the less releasability or fluctuated releasability to the storage equipment and device.

SUMMARY OF THE INVENTION

An object of the invention is to provide an external storage device having a simplified structure with satisfactory production yields.

Another object of the invention is to provide an external storage device with a high reliability in view point of recording and saving the data.

Further, another object of the invention is to provide an external storage device with a rapid access time.

Still another object of the invention is to provide an external storage device with high releasability for the storage equipment and device.

An external storage device according to the invention is comprised of an external storage device main and an external storage device unit, detail of which is as follows. The external storage device main includes a thin type external storage device module in which a storage medium series element containing at least one non-volatile semiconductor memory device is packaged and which is formed into a one-sided sealed package, and a flat type external connection terminal connected to an input/output terminal of the storage medium series element and led and exposed to a backside of the external storage device module. The external storage device unit includes a mechanism for engaging, insertedly attaching and detaching the external storage device main, and a resilient contact electrically connecting to the flat type external connection terminal of the external storage device main.

In the external storage device according to the present invention, the external storage device main may preferably be formed into a one-sided sealed package structure. However, for easier handling, the external storage device main may preferably be used in the form of a card type structure attached on the supporting plate. The external storage device unit may preferably be assembled and incorporated with a part or entire of the control circuit components or parts such as semiconductor elements constituting the control function.

The external storage device has a higher integration with a memory capacity to an extent of 16M-bits per chip. In addition, a main memory is provided with a non-volatile semiconductor memory device which does not require a power supply for maintaining storage. The main memory is formed into the one-sided sealed package to produce a thin type external storage device module or external storage device main. Thus, the external storage device module is easily achieved in a thin structure and at a lower cost by such as a transfer mold system. The attaching of the external storage device main to the external storage device unit is performed by an insertion system at the side surface of the external storage device unit in the card type. The external connection terminal is placed in a manner of plane on the rear-side of the external storage device main, hence, a high reliable electrical connection can easily be performed even when attaching and detaching by a one touch system for the external storage device unit. In the card type, the external storage device itself maintains and exhibits satisfactory releasability for the storage equipment and devices. The card type external storage device main can readily be attached and detached for the external storage device unit, and realizes a function of the floppy disk device as it is, and simultaneously a reliability of electrical connecting and disconnecting due to the attaching and detaching can be improved.

DESCRIPTION OF THE PREFERRED EMBODIMENTS

The invention is described referring to FIGS. 1 to 9 as follows.

The present invention has been achieved by means of a cleverly conceived structure and profile where the devices such as semiconductor memory devices or elements are mounted on the conventional substrates and in accordance with the fact that a non-volatile semiconductor memory device or element with a capacity of 16M-bits per chip corresponds to a 2 M-byte floppy disk.

Figure 1:
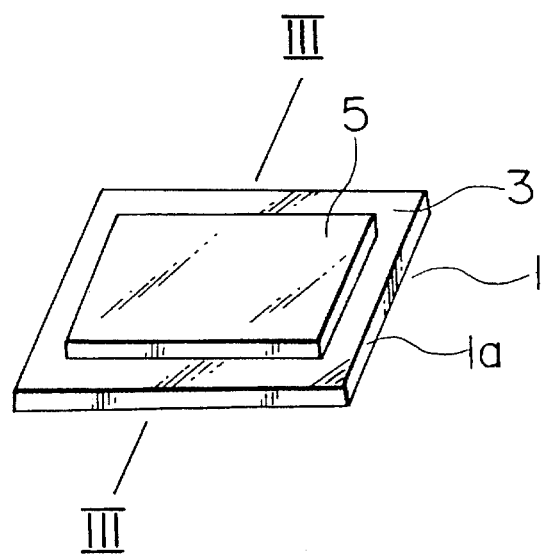
FIG. 1 is a top perspective view showing essentials of an example of an external storage device module according to the invention.
Figure 2:
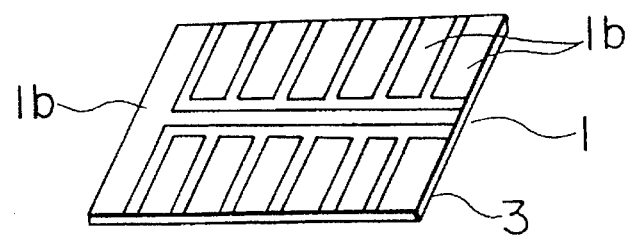
FIG. 2 is a bottom perspective view showing essentials of an example of an external storage device module according to the invention.
Figure 3:
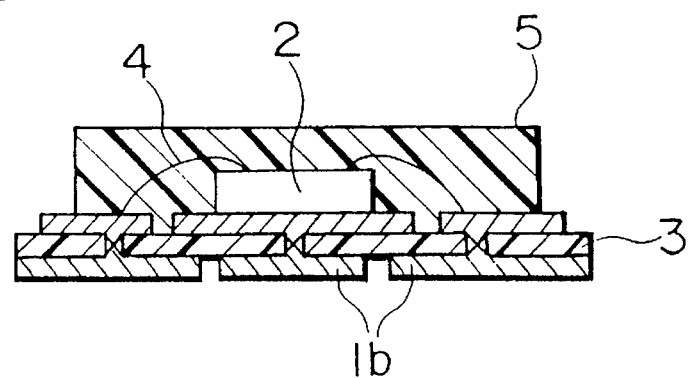
FIG. 3 is an enlarged sectional view taken along line III—III of FIG. 1 showing essentials of the example of the external storage device module according to the invention.

FIGS. 1 to 3 shows examples of an external storage device module constituting essentials of the thin type external storage device main according to the invention. FIG. 1 is a perspective view on one-side surface which is one-sided sealed by a transfer mold. FIG. 2 is a perspective view of rear-side surface which is one-side sealed by the transfer mold. FIG. 3 is a sectional view taken along line III—III of FIG. 1.

In this example, a card type external storage device module 1a (1) is constituted in that a storage medium series element including a 16M-bit NAND flash type non-volatile semiconductor memory device 2 is connected on a surface of the so called through hole type resin based wiring substrate 3 by wire-bonds 4. The storage medium series element is, if required, allowed to include an anti-electrostatic element for preventing electrostatic destruction, the element being used for input and output of the non-volatile semiconductor memory device 2. Instead of the wire bonds 4, flip chip bonding may preferably be performed to directly adhere the memory element rear-side on the resin based wiring substrate 3, which is a thin wiring substrate, for example, by using an insulative substrate member made of glass-epoxy resin or the like. The resin based wiring substrate 3, a surface of which is mounted with the storage medium series element and includes the NAND flash type non-volatile semiconductor memory device 2, is one-side sealed by a transfer mold layer 5. More specifically, the external storage device module 1 (it sometimes becomes the external storage device main as it is) is sealed of its one-sided surface and formed into a flat plate shaped thin type package with an entire thickness of less than about 1 mm. The transfer mold layer 5 may generally be formed of epoxy based resin or the like, and preferably may be formed of a composition containing inorganics.

On the other hand, the one-side sealed through hole type resin based wiring substrate 3, in other words, the backside surface of the external storage device module 1a (1) is arranged with a plane shaped or flat type terminal 1b taken out through the through hole to form the external storage device main 1. The plane shaped terminal 1b is gold (Au)-plated on its surface, and functions as an external connection terminal for electrically connecting to a contact member of an external storage device unit which is described later. In this example, the plane shaped terminal 1b is gold-plated to raise reliability of electrical connection, however, such plating is not always required.

Figure 4:
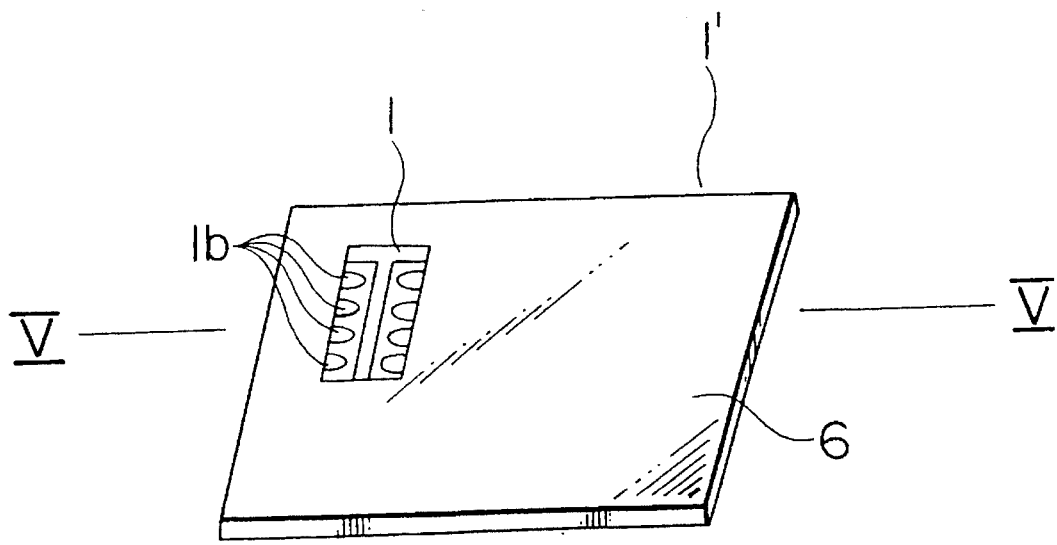
FIG. 4 is a top perspective view showing essentials of an example of an external storage device according to the invention.
Figure 5:
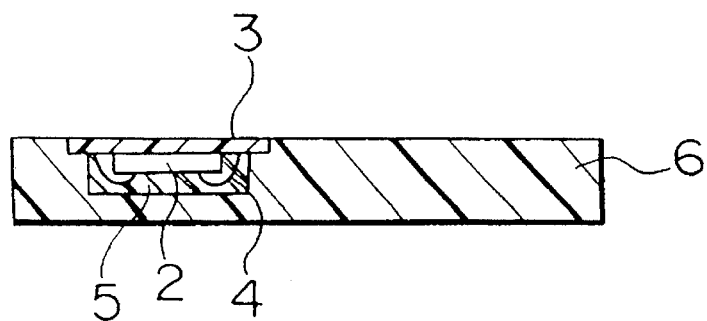
FIG. 5 is an enlarged sectional view taken along line V—V of FIG. 4 showing essentials of the example of the external storage device main according to the invention.

FIGS. 4 and 5 shows a structural example of the card type external storage device main 1' in which the thin type external storage device module 1a (1) is attached on a card shaped supporter 6. FIG. 4 is a perspective view, and FIG. 5 is a sectional view taken along line V—V of FIG. 4. The card shaped supporter 6 is, for example, an insulative resin plate.

In the example above, for a simplified operation the thin type external storage device module 1a (1) is incorporated into the card shaped supporter 6 sized of length 42.8 mm, width less than 27 mm, and thickness 0.76 mm each half the card size regulated in accordance with JEIDA. In more detail, the external storage device module 1a (1) is assembled into the card shaped supporter 6 having a recessed portion in which the external storage device module 1a (1) can previously be inserted and attached. In this assembling, a surface of the external connection terminal 1b of the external storage device module 1a (1) is inserted and attached in an exposed shape in a manner of forming the same plane as a main surface of the card shaped supporter 6, thereby forming the card type storage device main 1'.

Figure 6:
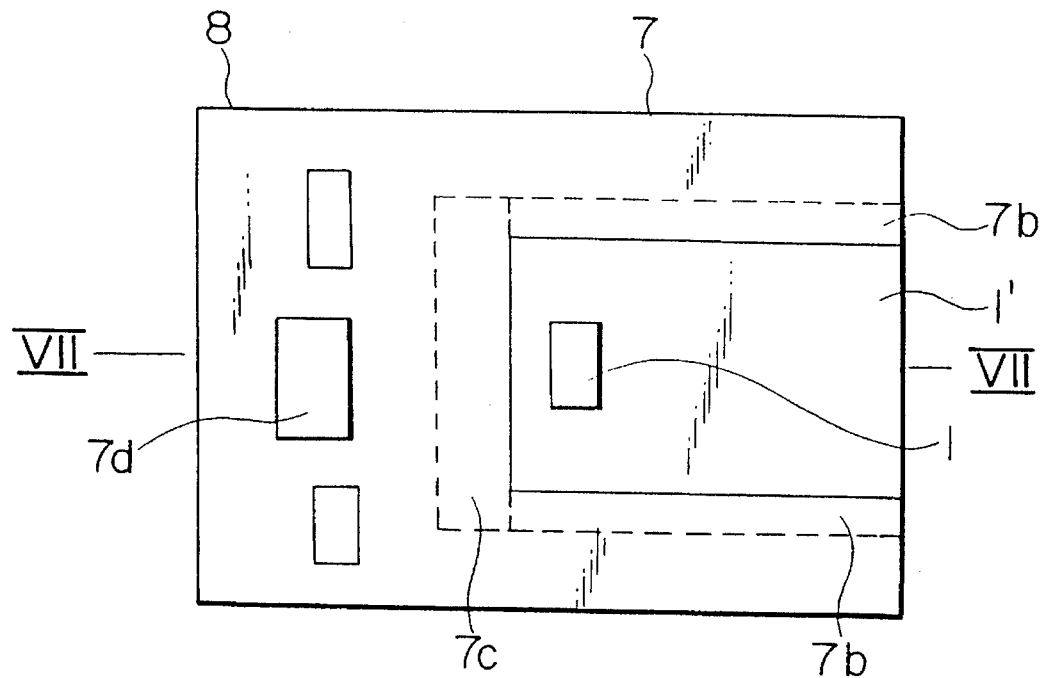
FIG. 6 is a plan view showing essentials of an example of an external storage device in which the external storage device main shown in FIG. 4 is assembled onto an external storage device unit.
Figure 7:
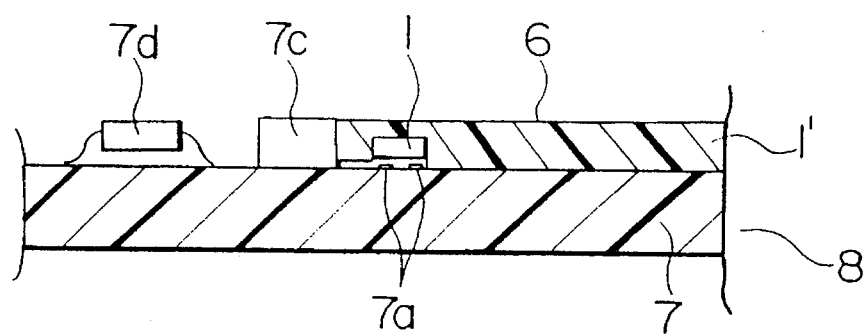
FIG. 7 is a sectional view taken along line VII—VII of FIG. 6.
Figure 8:
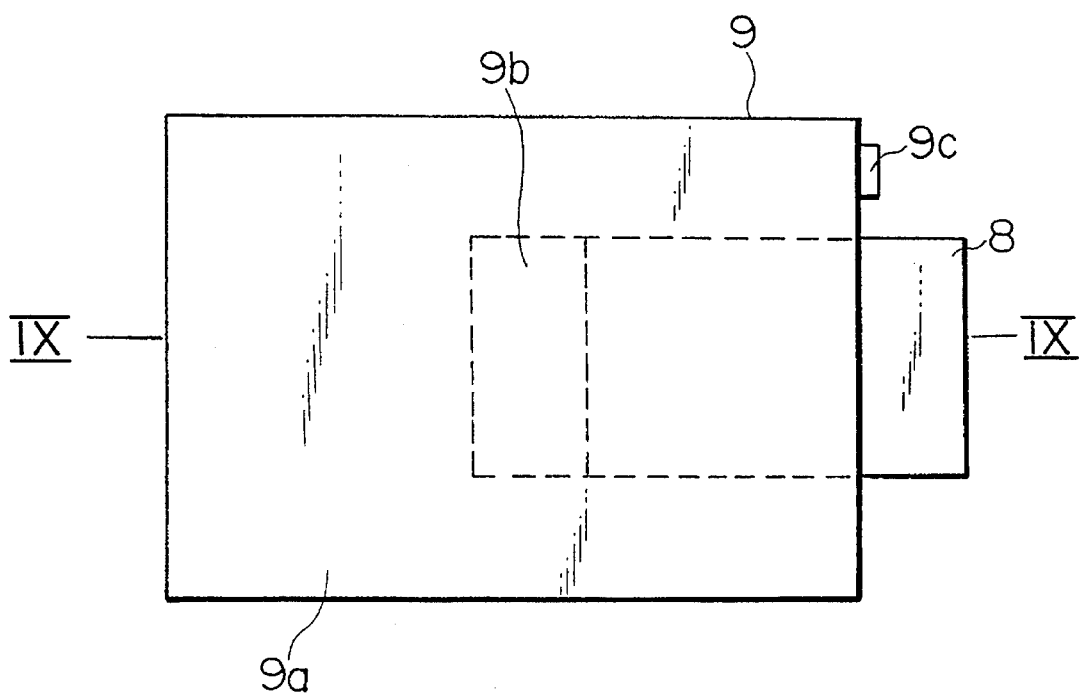
FIG. 8 is a plan view showing essentials of an example of another external storage device in which the external storage device main shown in FIG. 7 is assembled into an external storage device unit.
Figure 9:
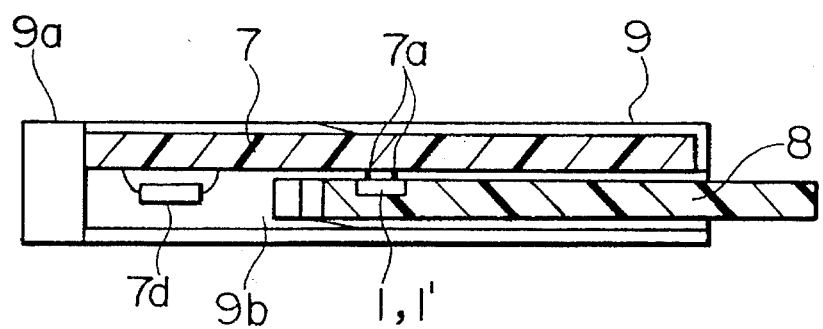
FIG. 9 is a sectional view taken along line IX—IX of FIG. 8.

FIGS. 6 and 7 show a structural example wherein the card type external storage device main 1' is attached on the external storage device unit 7. FIG. 6 is a plan view, and FIG. 7 is a sectional view taken along line VII—VII of FIG. 6.

In this example, the card type external storage device main 1' is a one-sided constituent element. The external storage device module 1a (1), in which the storage medium series element including at least the non-volatile semiconductor memory chip 2 is one-side sealed by the transfer mold, is inserted and attached into the card shaped supporter 6 to produce the card type external storage device main 1', which is premised on this example as described. The card type external storage device main 1' is releasably attached on and assembled into the external storage device unit main 7 to form an external storage device 8, where the external storage device unit main 7 can electrically be connected for the plane shaped external connection terminal 1b provided on the external storage device module 1a (1) on the card type external storage device main 1', and simultaneously the external storage device unit 7 has a structure that the card type external storage device main 1' is releasably attached.

The attaching structure for releasably attaching and detaching the card type external storage device main 1' is that the external storage device unit main 7 is provided on its surface with a recessed portion corresponding to shape and dimension of the card type external storage device main 1', a surface on the recessed portion is arranged with a contact 7a which is allowed to correspond to the external connection terminal 1b of the card type external storage device main 1'. To attach and detach the card type external storage device main 1' smoothly, a guide structure 7b and a one touch structure 7c are provided. When the card type external storage device main 1' is inserted, attached or removed in an arrow mark direction, then a smooth insertion and extraction is available by the guide structure 7b placed on a side-surface of the insertion and extraction direction. Simultaneously, the one touch structure 7c placed on a tip end in the insertion direction provides the secure attaching and electrical connection or the releases thereof. If required, a micro-switch system for supplying electricity to the card type external storage device main 1' may preferable to be provided the one touch structure 7c. In FIGS. 6 and 7, 7d depicts an IC element group constituting a part of a drive and control circuit of the storage medium series elements including the non-volatile semiconductor-memory chip 2 which the card type external storage device section 1' possesses. A contact 7a for electrically connecting to the external connection terminal 1b is made, for example, by a pin type contact having a spring mechanism.

The external storage device 8 attached with the card type external storage device main 1' according to the invention is not limited to the example as described above. For example, the structure shown in a plan view of FIG. 8 and in a sectional view of FIG. 9 taken along line IX—IX of FIG. 8 may preferably be taken into the present invention. The card type external storage device main 1' may preferably be inserted or extracted from a side-surface of a case 9 to be attached in the case 9 provided on one side with a pin connection 9a. The case 9 has, for example, a length of 85.6 mm, a width of 54.0 mm, and a thickness of 3.3 mm. In more detail, the casing 9 is provided with an insertion and extraction section 9b such as space or gap for attaching through inserting and extracting the card type external storage device main 1' from the side-surface of the case 9. A push button 9c may preferably be arranged previously on the case 9 to achieve attaching or detaching to the external storage device unit 7. In particular, in structure where the card type external storage device main 1' is attached by inserting and extracting from the side surface of the external storage device unit main 7, compared to the structure having the surface recessed portion for attaching the card type external storage device main 1', it is correspondingly not required to enlarge an outer surface required for attaching the external storage device. Thus, this easily realizes a compact size, fine view, and high reliability due to incorporation (inside mount) of the card type external storage device main 1'.

It is understood that the present invention is not limited to the example as hereinbefore described. For example, the card type external storage device main according to the invention may be used, as it is, without attaching on the card shaped supporter 6.

As is apparent from the description above, the external storage device according to the present invention has a higher integration and provides even in one chip a larger memory capacity of non-volatile semiconductor memory device as a main memory. In addition, the basic construction is employed in that the external storage device main is attached with a compact structure where the main memory described is one-side sealed by transfer mold. The use of the one-side sealing system and the non-volatile semiconductor memory device simply provides a thin structure and compact size of the external storage device. A releasability on attaching and ease of carrying provide simple operation and handling, and result in a lower cost. When forming the external storage device by combining with the external storage device unit, reliability in the card type external storage device can be improved preventing damage or connection failures of the external connection terminal with a graded releasability due to satisfactory slidability. In particular, a large amount of advantages in practical use are obtained, in optionally detaching or easily carrying the external storage device main without the possibility of outer damage, or in a larger capacity of recording or saving the data even in a compact size.

What is claimed is:

1. An external storage device characterized by comprising:

an external storage device main including,
   a thin type external storage device module in which a storage medium series element containing at least one non-volatile semiconductor memory device is packaged, and which is formed into a one-sided sealed package, and
   a flat type external connection terminal connected to an input/output terminal of the storage medium series element and led and exposed to a backside of the thin type external storage device module; and an external storage device unit including,
   means for engaging, insertedly and rigidly attaching and detaching the external storage device main,
   a resilient contact electrically connecting to the flat type external connection terminal of the external storage device main, and
   means for driving and controlling the storage medium series element.

2. An external storage device as claimed in claim 1, wherein the external storage device main is formed in a card type.

3. An external storage device as claimed in claim 1, wherein the external storage device main and the external storage device unit are respectively formed in a card type.

4. An external storage device as claimed in claim 3, wherein the card type external storage device unit has a recessed portion corresponding to shape and dimension of the card type external storage device main on its surface, the card type external storage device main being rigidly and detachably engaged with the card type external storage device unit at the recessed portion to form a card type external storage device.

5. An external storage device as claimed in claim 3, wherein the card type external storage device unit has an insertion and extraction section for attaching the card type external storage device main from a side face of the card type external storage device unit.

6. An external storage device as claimed in claim 1, wherein the storage medium series element of the external storage device main comprises an anti-electrostatic element for preventing electrostatic destruction.

7. An external storage device as claimed in claim 1, 2, 3, 4, 5 or 6, wherein the non-volatile semiconductor memory device of an external storage device main is a NAND flash memory.

8. An external storage device as claimed in claim 1, wherein the external connection terminal surface of an external storage device main is coated with a gold plated layer.

9. An external storage device as claimed in claim 3, wherein the card type external storage device unit has a space for receiving the card type external storage device main therein.

10. An external storage device as claimed in claim 9, wherein the card type external storage device unit has a thickness of about 3.3 mm.

11. An external storage device as claimed in claim 9, wherein the card type external device main has a thickness of less than 1 mm.

* * * * *

(12) EX PARTE REEXAMINATION CERTIFICATE (5050th)
United States Patent
Iwasaki

(10) Number: US 5,550,709 C1
(45) Certificate Issued: Jan. 4, 2005

(54) EXTERNAL STORAGE DEVICE

(75) Inventor: Hiroshi Iwasaki, Yokohama (JP)

(73) Assignee: Kabushiki Kaisha Toshiba, Kawasaki (JP)

Reexamination Request:
No. 90/004,442, Nov. 29, 1996

Reexamination Certificate for:
Patent No.: 5,550,709
Issued: Aug. 27, 1996
Appl. No.: 08/205,451
Filed: Mar. 4, 1994

(30) Foreign Application Priority Data

Jul. 23, 1993 (JP) .............................................. 5-182650

(51) Int. Cl.$^7$ .............................................. H05K 7/10
(52) U.S. Cl. ........................ 361/684; 361/737; 235/492
(58) Field of Search ................................ 361/683, 684, 361/737, 754, 733; 235/492; 439/160; 428/76

(56) References Cited

U.S. PATENT DOCUMENTS

| | | | |
|---|---|---|---|
| 4,264,917 A | * 4/1981 | Ugon ........................... 257/668 |
| 4,837,628 A | 6/1989 | Sasaki |
| 4,916,662 A | * 4/1990 | Mizuta ........................ 235/492 |
| 5,018,017 A | 5/1991 | Sasaki et al. |
| 5,027,190 A | 6/1991 | Haghiri-Tehrani et al. |
| 5,061,845 A | 10/1991 | Pinnavaia |
| 5,079,673 A | * 1/1992 | Kodai et al. ................. 361/737 |
| 5,091,618 A | * 2/1992 | Takahashi .................... 235/441 |
| 5,155,663 A | * 10/1992 | Harase ........................ 361/684 |
| 5,172,338 A | 12/1992 | Mehrotra et al. |
| 5,272,374 A | * 12/1993 | Kodai et al. ................. 257/679 |
| 5,276,317 A | 1/1994 | Ozouf et al. |

(List continued on next page.)

FOREIGN PATENT DOCUMENTS

| | | |
|---|---|---|
| EP | 0-214 478 | 3/1987 |
| EP | 0 228 278 A1 | 7/1987 |
| EP | 0-228-278 | 7/1987 |
| EP | 0-321-326 | 6/1989 |
| EP | 0-385-750 | 9/1990 |
| EP | 0 392 895 A2 | 10/1990 |
| EP | 0-406-610 | 1/1991 |
| EP | 0-476-892 | 3/1992 |
| EP | 0 533 542 A1 | 3/1993 |
| JP | 2-301155 | 12/1990 |
| JP | 3-14192 | 1/1991 |
| JP | 4-16396 | 1/1992 |
| JP | 0 5120501 | 5/1993 |
| JP | 6-195524 | 7/1994 |
| JP | 6-236316 | 8/1994 |
| JP | 6-318390 | 11/1994 |

OTHER PUBLICATIONS

Kirisawa et al. ,"A NAND Structured Cell with a New Programming Technology for Highly Reliable 5V–Only Flash EEPROM", IEEE 1990 Symposium on VLSI Technology, pp 129–30.*

Pashley et al., "Flash memories: the best of two worlds", IEEE Spectrum, Dec. 1989, p 30–33.*

EP–A–O 214, 478 (Allied Corp.); Mar. 18, 1987.*

Ralston, A. et al., Ed., *Encyclopedia of Computer Science*, Third Edition, 1993, p. 900.

Microsoft Press, *Computer Dictionary*, 1993, p. 136.

*Primary Examiner*—Hien Phan

(57) ABSTRACT

An external storage device includes an external storage device main and an external storage device unit. The external storage device main includes a thin type external storage device module formed into a one-side sealed package and having a storage medium series element containing at least one non-volatile semiconductor memory device, and a flat type external connection terminal connected to an input/output terminal of the storage medium series element and led and exposed to a backside of the external storage device module. The external storage device unit includes an external storage device main detachable section for engaging, insertedly attaching and detaching the external storage device main, a resilient contact electrically connecting to the external connection terminal of the external storage device main to be mounted, and at least a part of circuit function for driving and controlling the storage medium series element.

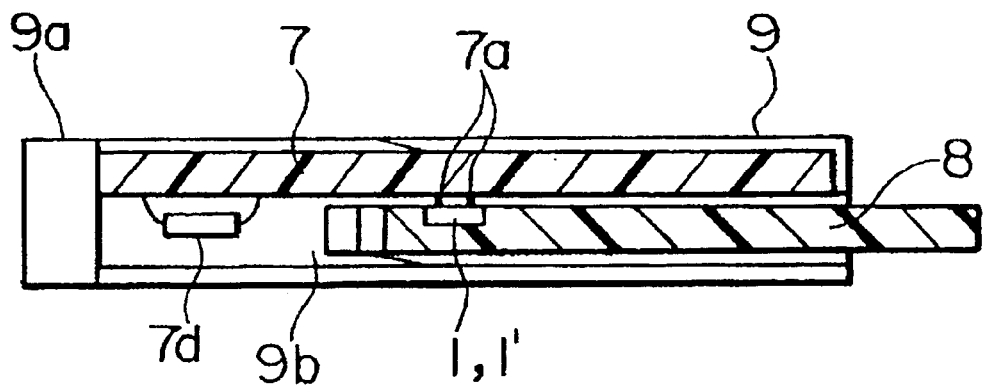

U.S. PATENT DOCUMENTS

| | | | |
|---|---|---|---|
| 5,293,236 A | | 3/1994 | Adachi et al. |
| 5,297,029 A | * | 3/1994 | Nakai et al. ............. 365/238.5 |
| 5,297,148 A | | 3/1994 | Harari et al. |
| 5,343,319 A | | 8/1994 | Moore |
| 5,388,084 A | * | 2/1995 | Itoh et al. ................... 365/226 |
| 5,402,095 A | | 3/1995 | Janniere |
| 5,428,569 A | | 6/1995 | Kato et al. |
| 5,430,859 A | | 7/1995 | Norman et al. |
| 5,434,395 A | * | 7/1995 | Storck et al. ................ 235/380 |
| 5,438,359 A | | 8/1995 | Aoki |
| 5,457,590 A | | 10/1995 | Barrett et al. |
| 5,469,399 A | * | 11/1995 | Sato et al. ................... 365/226 |
| 5,475,441 A | | 12/1995 | Parulski et al. |
| 5,488,433 A | | 1/1996 | Washino et al. |
| 5,508,971 A | | 4/1996 | Cernea et al. |
| 5,509,018 A | * | 4/1996 | Niijima et al. ............. 371/10.2 |
| 5,526,233 A | * | 6/1996 | Hayakawa .................. 361/737 |
| 5,535,328 A | | 7/1996 | Harari et al. |
| 5,563,825 A | | 10/1996 | Cernea et al. |
| 5,566,105 A | * | 10/1996 | Tanaka et al. .......... 365/185.22 |
| 5,568,424 A | | 10/1996 | Cernea et al. |
| 5,572,466 A | * | 11/1996 | Sukegawa .............. 365/185.33 |
| 5,572,478 A | * | 11/1996 | Sato et al. ................... 365/226 |
| 5,584,043 A | | 12/1996 | Burkart |
| 5,592,420 A | | 1/1997 | Cernea et al. |
| 5,596,532 A | | 1/1997 | Cernea et al. |
| 5,602,987 A | | 2/1997 | Harari et al. |
| 5,608,673 A | * | 3/1997 | Rhee ...................... 365/185.33 |
| 5,615,344 A | | 3/1997 | Corder |
| 5,621,685 A | | 4/1997 | Cernea et al. |
| 5,638,321 A | * | 6/1997 | Lee et al. ............... 365/185.17 |
| 5,663,901 A | | 9/1997 | Wallace et al. |
| 5,671,229 A | | 9/1997 | Harari et al. |
| 5,693,570 A | | 12/1997 | Cernea et al. |
| 5,887,145 A | | 3/1999 | Harari et al. |

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–4 and 7–8 are determined to be patentable as amended.

Claims 5, 6 and 9–11, dependent on an amended claim, are determined to be patentable.

New claims 12–25 are added and determined to be patentable.

1. An external storage device [characterized by] comprising:
    an external storage device main including,
        a thin type external storage device module in which a storage medium series element containing at least one non-volatile semiconductor memory device is packaged, [and which is formed into a one-sided sealed package,] *the module including a substrate having a first face and a second face, the first face having a first region and a second region, a wiring pattern formed on the first face and which extends from the first region to the second region, the storage medium series element having an input/output terminal, and being mounted in the first region of the first face of the substrate, the input/output terminal being connected with the wiring pattern in the first region,*
        *a sealing resin formed on the first region of the first face of the substrate and not formed on the second region of the first face of the substrate to seal the storage medium series element,* and
        a flat type external connection terminal connected to [an] *the* input/output terminal of the storage medium series element and led and exposed to a backside of the thin type external storage device module; and
    an external storage device unit including,
        means for engaging, insertedly and rigidly attaching and detaching the external storage device main,
        a resilient contact electrically connecting to the flat type external connection terminal of the external storage device main, and
        means for driving and controlling the storage medium series element.

2. An external storage device as claimed in claim 1, wherein the external storage device main [is formed in] *has* a card type *shape*.

3. An external storage device as claimed in claim 1, wherein the external storage device main and the external storage device unit [are] respectively [formed in] *have* a card type *shape*.

4. An external storage device as claimed in claim 3, wherein the card type external storage device unit has a recessed portion *on its surface* corresponding to *a* shape and dimension of the card type external storage device main [on its surface], the card type external storage device main being rigidly and detachably engaged with the card type external storage device unit at the recessed portion to form a card type external storage device.

7. An external storage device as claimed in claim 1, 2, 3, 4, 5, or 6, wherein the non-volatile semiconductor memory device of [an] *the* external storage device main is a NAND flash memory.

8. An external storage device as claimed in claim 1, wherein *a surface of* the external connection terminal [surface] of [an] *the* external storage device main is coated with a gold plated layer.

12. *The external storage device as recited in claim 1, wherein the at least one non-volatile semiconductor device comprises a flash type non-volatile semiconductor memory.*

13. *The external storage device as recited in one of claims 1–6 and 8–11, wherein the resilient contact is connected to the means for driving and controlling the storage element.*

14. *The external storage device as recited in claim 3, wherein the external storage device unit interfaces with the external storage device main and comprises no storage element.*

15. *An external storage device comprising:*
    *an external storage device main including,*
        *a thin type external storage device module, including a substrate having a first face and a second face, the first face having a first region and a second region, a wiring pattern formed on the first face, which extends from the first region to the second region, and a storage medium series element containing at least one non-volatile semiconductor memory, the storage medium series element having an input/output terminal and being mounted in the first region of the first face of the substrate, the input/output terminal being connected with the wiring pattern in the first region, and a sealing resin formed on the first region of the first face of the substrate and not formed on the second region of the first face of the substrate to seal the storage medium series element,*
        *a flat type external connection terminal connected to the input/output terminal of the storage medium series element and led and exposed on a backside of the module corresponding to the second face, and*
        *a card shaped support having a surface and having a recess for placing the thin type external storage device module so that the second face of the module is exposed on the surface of the support; and*
    *an external storage device unit including,*
        *means for engaging, insertedly and rigidly attaching and detaching the external storage device main,*
        *a resilient contact electrically connecting to the flat type external connection terminal of the external storage device main, and*
        *means for driving and controlling the storage medium series element.*

16. *The external storage device as recited in claim 15, wherein the external storage device module is placed into the recess of the support so that a surface of the flat type external connection terminal is substantially flush with the surface of the support.*

17. *An external storage device comprising:*
    *an external storage device main including,*
        *a thin type external storage device module comprising a substrate having a first face and a second face, the first face having a first region and a second region,* a wiring pattern formed on the first face, which extends from the first region to the second region, a storage medium series element containing at least one non-volatile semiconductor memory having an input/output terminal, wherein a sealing resin is formed on the first region of the first face of the substrate and not formed on the second region of the first face of the substrate to seal the storage medium series element, a flat type external connection terminal connected to the input/output terminal of the storage element and led and exposed to a backside of the module corresponding to the second face, and a card shaped support having a surface and having a recess for placing the thin type external storage device module so that the second face of the substrate is exposed to the surface of the support; and an external storage device unit including, means for engaging, insertedly and rigidly attaching and detaching the external storage device main, a resilient contact electrically connecting to the flat type external connection terminal of the external storage device main, and means for driving and controlling the storage medium series element.

18. The external storage device as recited in claim 17, wherein the external storage device module is placed into the recess of the support so that a surface of the flat external connection terminal is substantially flush with the surface of the support.

19. An external storage device comprising:

an external storage device main including, a thin type external storage device module in which a storage medium series element containing at least one NAND flash non-volatile semiconductor memory device is packaged, the module including a substrate having a first face and a second face, the first face having a first region and a second region, a wiring pattern formed on the first face and which extends from the first region to the second region, the storage medium series element having an input/output terminal, and being mounted in the first region of the first face of the substrate, the input/output terminal being connected with the wiring pattern in the first region, and a sealing resin formed on the first region of the first face of the substrate and not formed on the second region of the first face of the substrate to seal the storage medium series element, and a flat type external connection terminal connected to the input/output terminal of the storage medium series element and led and exposed to a backside of the thin type external storage device module; and an external storage device unit including, means for engaging, insertedly and rigidly attaching and detaching the external storage device main, a resilient contact electrically connecting to the flat type external connection terminal of the external storage device main, and means for driving and controlling the storage medium series element to cause the at least one NAND flash non-volatile semiconductor memory device to receive and output data via the input/output terminal.

20. The external storage device as recited in claim 19, wherein the storage medium series element consists essentially only of NAND flash non-volatile semiconductor memory.

21. The external storage device as recited in one of claims 1, 15, 17, and 19, wherein the storage medium series element is electrically connected to the flat type external connection terminal by flip chip bonding.

22. The external storage device as recited in one of claims 1, 15, 17, and 19, wherein the storage medium series element is electrically connected to the flat type external connection terminal by wire bonding.

23. An external storage device comprising:

an external storage device main including a thin type external storage device module comprising:

a through hole type resin based wiring substrate having a first side and a second side, the first side having a first region and a second region, a wiring pattern formed on the first side and which extends from the first region to the second region, a storage series medium series element provided as a NAND flash non-volatile semiconductor memory device, having an input/output terminal, electrically connected to the first side of the through hole type resin based wiring substrate, and being mounted in the first region of the first side of the substrate a transfer mold layer formed on the first region of the first side of the through hole type resin based wiring substrate and not formed on the second region of the first side of the through hole type resin based wiring substrate, and resin sealing the NAND flash non-volatile semiconductor memory device to form a one-sided sealed package, and a flat type external connection terminal connected to the input/output terminal of the NAND flash non-volatile semiconductor memory device and formed on the second side of the through hole type resin based wiring substrate so that the flat type terminal is exposed on a backside of the module; and an external storage device unit including, means for engaging, insertedly and rigidly attaching and detaching the external storage device main, a resilient contact electrically connecting to the flat type external connection terminal of the external storage device main, and means for driving and controlling the NAND flash non-volatile semiconductor memory device.

24. The external storage device as recited in claim 23, wherein the NAND flash non-volatile semiconductor memory device is electrically connected to the first side of the through hole type resin based wiring substrate by a plurality of wire bonds.

25. The external storage device as recited in claim 23, wherein the NAND flash non-volatile semiconductor memory device is electrically connected to the first side of the through hole type resin based wiring substrate by flip chip bonding.

* * * * *